(12) United States Patent
Tominaga et al.

(10) Patent No.: US 8,383,989 B2
(45) Date of Patent: Feb. 26, 2013

(54) COOKING DEVICE

(75) Inventors: Hiroshi Tominaga, Hyogo (JP); Fumitaka Ogasawara, Hyogo (JP); Keiko Isoda, Hyogo (JP); Tamotsu Izutani, Hyogo (JP)

(73) Assignee: Panasonic Corporation, Osaka (JP)

( * ) Notice: Subject to any disclaimer, the term of this patent is extended or adjusted under 35 U.S.C. 154(b) by 494 days.

(21) Appl. No.: 12/663,377

(22) PCT Filed: Jun. 6, 2008

(86) PCT No.: PCT/JP2008/001450
§ 371 (c)(1),
(2), (4) Date: Dec. 7, 2009

(87) PCT Pub. No.: WO2008/149561
PCT Pub. Date: Dec. 11, 2008

(65) Prior Publication Data
US 2010/0176113 A1 Jul. 15, 2010

(30) Foreign Application Priority Data

Jun. 7, 2007 (JP) ................................. 2007-151410
Apr. 9, 2008 (WO) .................. PCT/JP2008/000920

(51) Int. Cl.
*H05B 1/00* (2006.01)
(52) U.S. Cl. ...................................................... 219/220
(58) Field of Classification Search .................... 219/220
See application file for complete search history.

(56) References Cited

U.S. PATENT DOCUMENTS

| 2003/0164370 | A1 | 9/2003 | Aihara et al. |
| 2009/0032007 | A1 | 2/2009 | Satou |
| 2009/0261088 | A1 | 10/2009 | Isoda et al. |

FOREIGN PATENT DOCUMENTS

| CN | 1578544 | 2/2005 |
| DE | 10 2004 026 836 | 12/2005 |

(Continued)

OTHER PUBLICATIONS

English translation of International Preliminary Report on Patentability and Written Opinion of the International Searching Authority, issued Dec. 7, 2009, in PCT/JP2008/001450.

(Continued)

*Primary Examiner* — Marcos D. Pizarro
*Assistant Examiner* — Sue Tang
(74) *Attorney, Agent, or Firm* — Wenderoth, Lind & Ponack, LLP.

(57) ABSTRACT

A cooking device, that prevents erroneous operations which are not intended by a user, includes a top plate on an upper surface of a main body, a heating section to perform induction-heating of a bottom surface of an object to be heated that is placed on the upper portion of the main body, a control unit to control heating output of a heating coil, one or more operation switches at the top plate, a light source to illuminate the operation switch, and a connection terminal to electrically connect the operation switch to the control unit. The operation switch includes a conductive detection section to detect that a user touches the conductive detection section based on capacitance change, and a conductive connection section contacted with the connection terminal. The connection section is formed to be directly connected to a portion of an outer edge of the detection section.

9 Claims, 2 Drawing Sheets

FOREIGN PATENT DOCUMENTS

| | | |
|---|---|---|
| JP | 63-139734 | 9/1988 |
| JP | 10-214677 | 8/1998 |
| JP | 2003/142244 | 5/2003 |
| JP | 2003-208972 | 7/2003 |
| JP | 2003-272816 | 9/2003 |
| JP | 2003272816 A * | 9/2003 |
| JP | 2005-38739 | 2/2005 |
| JP | 2005038739 A * | 2/2005 |
| JP | 2005-93209 | 4/2005 |
| JP | 2005093209 A * | 4/2005 |
| JP | 3741667 | 2/2006 |
| JP | 2006-128019 | 5/2006 |
| JP | 2006-196395 | 7/2006 |
| JP | 2006-318735 | 11/2006 |
| JP | 2007-107800 | 4/2007 |
| JP | 2008-91193 | 4/2008 |
| WO | 01/07835 | 2/2001 |
| WO | 2007/043505 | 4/2007 |
| WO | 2008/013220 | 1/2008 |

OTHER PUBLICATIONS

International Search Report issued Sep. 16, 2008 in International (PCT) Application No. PCT/JP2008/001450.
European Search Report, issued Apr. 3, 3012 in European application 08 76 4046.2, which is a counterpart to the present application.
International Search Report issued Jul. 15, 2008 in International (PCT) Application No. PCT/JP2008/000920.
International Preliminary Report on Patentability (including Written Opinion of the International Searching Authority) issued Nov. 30, 2010 in International (PCT) Application No. PCT/JP2008/000920.
Extended European Search Report issued Apr. 19, 2012 in European Application No. 08 764 047.0.

* cited by examiner

COOKING DEVICE

BACKGROUND OF THE INVENTION

1. Technical Field

The present invention relates to a cooking device including an induction heating cooking device and a gas cooking device which have a top plate provided with a capacitive switch on an upper portion of its main body.

2. Background Art

As described in JP-3741667, a conventional induction heating cooking device includes an operation section which enables a user to operate heating of an object to be heated, a conductive detection section which is provided on the back surface of the operation section and detects that a user's finger has been touched to the operation section, and a control unit which controls a heating coil based on a detection result by the detection section. The detection section and the control unit are electrically connected to each other, since the control unit is connected, through a connection terminal, to a conductive connection section which is electrically connected to the detection section through connection conductive wiring. Further, such a conventional induction heating cooking device illuminates the operation section from below by using a back light, and is provided with a transparent portion through which an illumination light from the back light passes, at the periphery of the operation section. Thus, the position of the operation section and the contents of operations indicated by the operation section can be indicated for the user.

In the conventional induction heating cooking device, the connection section which is contacted with the connection terminal is conductive and, therefore, if a user's finger touches the connection section, this changes the capacitance in the connection section, similarly to the case where a user's finger touches the detection section, which has induced the problem that the control unit wrongly determines that the operation section has been operated. Particularly, in a conventional cooking device having a top plate provided with an operation section, a transparent portion through which an illumination light from a back light can pass, is provided at the periphery of the operation section and, therefore, the connection section is placed outside the transparent portion, in order to prevent the connection section from obstructing the transparent portion. Accordingly, the connection section is at a position far from the detection section, and operations induced by touching the connection section have been erroneous operations which are not intended by users.

The present invention is made for overcoming the aforementioned problem and aims at providing a cooking device capable of facilitating operations to improve the operability and preventing erroneous operations which are not desired by users.

SUMMARY OF THE INVENTION

A cooking device according to the present invention includes a top plate that is provided on an upper portion of a main body, a heating section operable to heat a bottom surface of an object to be heated that is placed on the upper portion of the main body, and a control unit which controls a heating output of the heating section. The cooking device further includes: one or more operation switches that are provided at the top plate; a light source operable to illuminate the operation switch; and a connection terminal operable to electrically connect the operation switch to the control unit. The operation switch include a conductive detection section operable to detect that a user touches the conductive detection section based on capacitance change, and a conductive connection section that is contacted with the connection terminal, and the connection section is formed to be directly connected to a portion of an outer edge of the detection section.

In this case, the "light source" corresponds to a "back light 17" in an embodiment, and the "control unit" corresponds to a "printed-wiring board 24" in the embodiment.

The operation switch may further include a frame display section that is formed by cutting out a portion of the inside of the detection section ("cutting out" means forming a cutout portion as in negative printing, which will similarly apply to the following description) and displays a frame of the detection section.

The operation switch may further be provided, inside the frame display section, with a content-of-operation display section that is formed by cutting out a portion of the inside of the detection section and indicates the content of the operation switch.

The cooking device may further include a light shield section operable to prevent light from the light source from being directed to a front portion of the top plate, around an outer periphery of the detection section, wherein an inner edge of the light shield section may fall within a range between an outer edge of the frame display section and an outer edge of the detection section, and an outer edge of the light shield section may be outside an outer edge of the light source.

The connection section may be provided in a backward direction with respect to the detection section.

The detection section may be provided above the light source, and a portion of the connection section may be provided outside the light source.

The light source may illuminate only the operation switches usable in the operating condition of the cooking device.

According to the cooking device according to the present invention, it is possible to offer the advantages of facilitating operations and preventing erroneous operations which are not intended by users.

DETAILED DESCRIPTION OF THE INVENTION

Hereinafter, an embodiment of the present invention will be described with reference to the drawings. A cooking device according to the present invention will be described by exemplifying an induction heating cooking device which includes a main body including an inverter, a cooling fan and the like, and a top unit mounted to an upper portion of the main body. The top unit is constructed by a top plate made of a crystallized ceramic through which light can pass, and a metal frame provided at the periphery of the top plate. Under the top plate, there is provided at least a single heating coil (two heating coils in FIG. 1) for generating a magnetic field to perform induction heating on an object to be heated. The top plate provided in the induction heating cooking device having the aforementioned structure will be described, hereinafter, with reference to FIG. 1.

Figure 1:
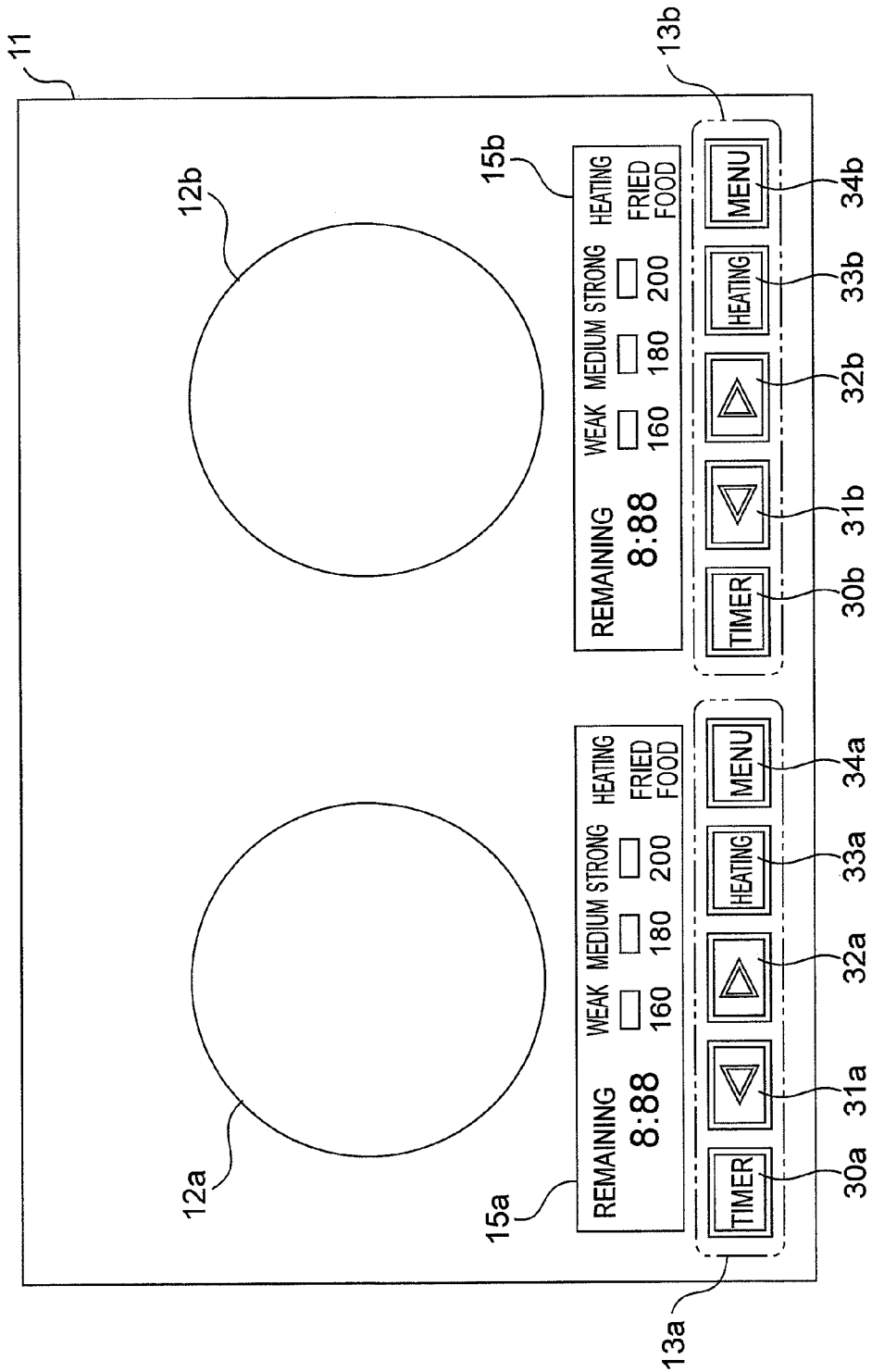
FIG. 1 is a plan view illustrating a top plate according to an embodiment of the present invention.

FIG. 1 illustrates the top plate 11 in the induction heating cooking device according to the present invention. Heating sections 12a and 12b indicative of portions in which an object to be heated should be placed are displayed through printing on the upper surface or the lower surface of the top plate 11. The heating sections 12a and 12b are displayed by forming printed layers in circular shapes at positions which align with the heating coils (the heating coil 10 in FIG. 3) provided below. In the front portion of the top plate 11, operation sections 13a and 13b for setting outputs about the ON/OFF states of the heating coils 10 and display sections 15a and 15b which display the operation conditions of the heating sections 12a and 12b are provided. The numbers of the heating sections 12a and 12b, the operation sections 13a and 13b and the display sections 15a and 15b provided therein are the same as the number of the heating coils 10. The heating sections 12a and 12b, the operation sections 13a and 13b and the display sections 15a and 15b which are provided in the right and left sides have the same structures and, therefore, the following description will be given by representatively using the heating section 12a, the operation section 13a and the display section 15a in the left side.

The operation section 13a includes a plurality of operation switches 30a to 34a. The operation switches 30a to 34a are capacitive switches which detect that a user's finger has been touched to the capacitive switches. In FIG. 1, the plurality of operation switches 30a to 34a are a menu switch 34a, a heating switch 33a, a heating-power control switch 31a, a heating-power control switch 32a, and a timer switch 30a. The menu switch 34a is a switch for controlling the validity/invalidity of the operations on the other operation switches 30a to 33a and is a switch which is lighted at first after power-on. The heating switch 33a is a switch for starting/stopping heating of the object to be heated. The heating-power control switch 31a is a switch for decreasing the heating power, and the heating power is gradually decreased every time the heating-power control switch 31a is pushed. The heating-power control switch 32a is a switch for increasing the heating power, and the heating power is gradually increased every time the heating-power control switch 32a is pushed. The timer switch 30a is a switch for setting the cooking time, and, for example, the cooking time is increased every time the timer switch 30a is pushed, and the remaining cooking time set by the timer switch 30a is displayed on the display section 15a.

In using this induction heating cooking device, if an object to be heated is placed on the heating section 12a which aligns with the heating coil 10 and, thereafter, the power is turned on, only the menu switch 34a is lighted at first. If the menu switch 34a is operated, then the heating switch 33a is lighted. If the heating switch 33a is operated to start heating, then the heating-power control switches 31a and 32a and the timer switch 30a are lighted. As described above, only the usable operation switches are lighted in each case, and the user performs cooking which he or she desires by operating the operation switches 30a to 34a. At this time, the display section 15a displays the operation condition of the heating section 12a based on the operation switches 30a to 34a which have been operated.

Figure 2:
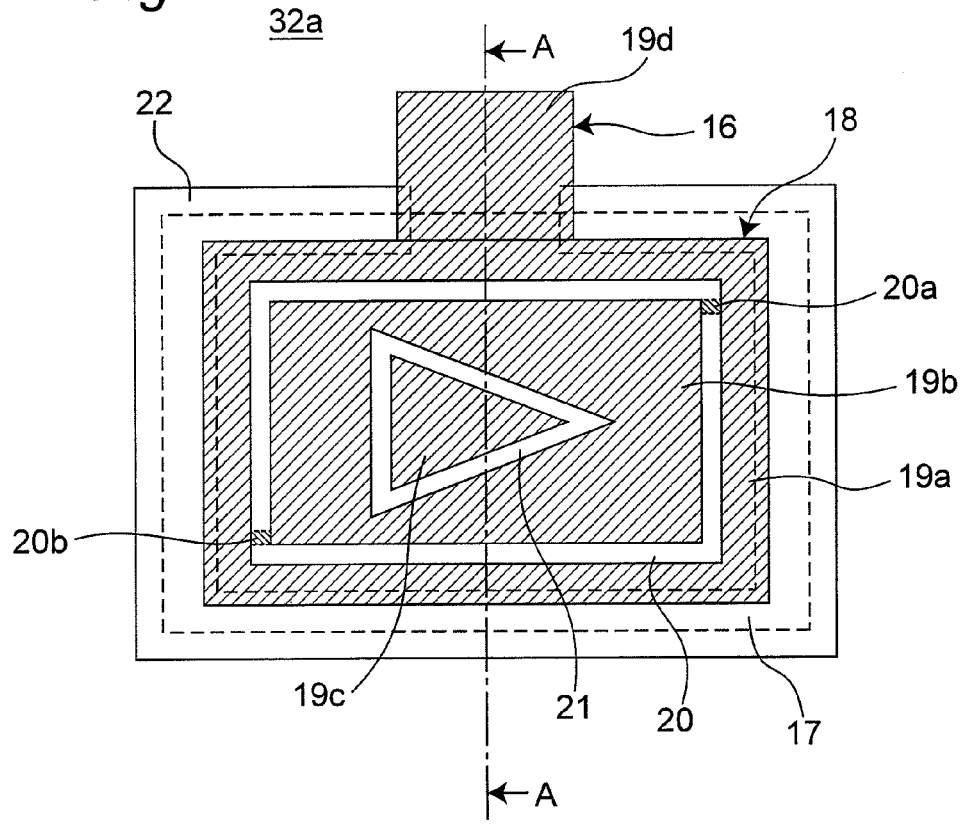
FIG. 2 is a plan view illustrating an operation switch provided in the top plate.
Figure 3:
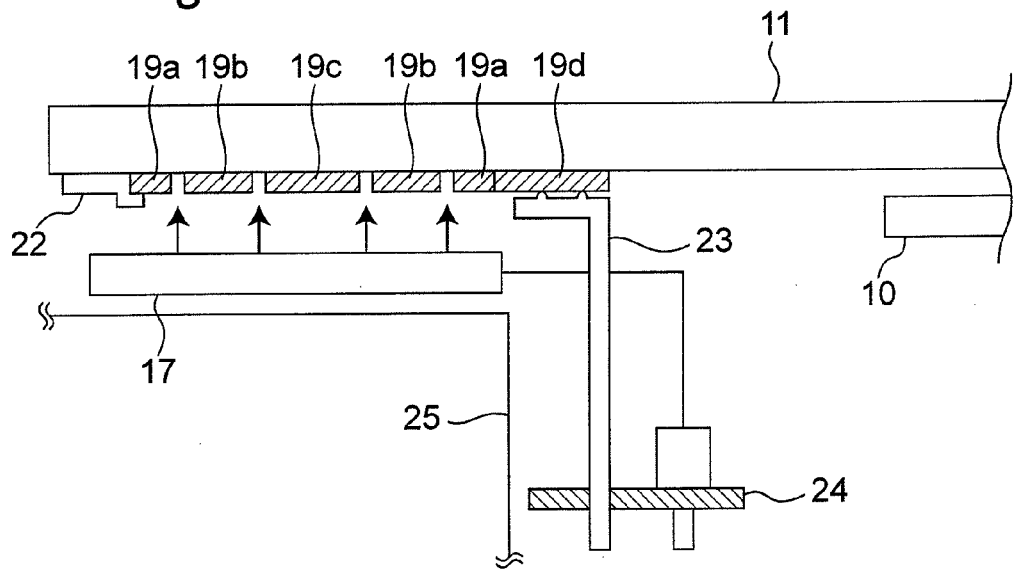
FIG. 3 is a cross-sectional view taken along line A-A in FIG. 2.

Next, with reference to FIG. 2 and FIG. 3, the structures of the operation switches 30a to 34a constituting main parts of the present invention will be described, hereinafter, by representatively describing the operation switch 32a for the heating-power control. FIG. 2 is a plan view illustrating the operation switch 32a which exhibits a triangular shape for controlling the heating power. FIG. 3 is a cross-sectional view taken along line A-A in FIG. 2, illustrating portions of the top plate 11 and the heating coil 10.

The operation switch 32a includes a detection section 18 which detects a user's finger having been touched thereto, and a connection section 16 with which a conductive connection terminal 23 is contacted. The detection section 18 and the connection section 16 are formed by printing using conductive paint having a light shielding characteristic, such as paint containing carbon. The detection section 18 includes a frame display section 20 for approximately indicating the size and the position of the outer periphery of the detection section 18, and a content-of-operation display section 21 for indicating the content of operation of the operation switch 32a. The detection section 18 and the connection section 16 are formed by printing electrodes 19a to 19d (hereinafter, the electrodes 19a to 19d will be collectively referred to as "electrodes 19"), on the back surface of the top plate 11. The frame display section 20 and the content-of-operation display section 21 are formed by cutting them out from these electrodes 19.

The induction heating cooking device according to the present invention includes a back light 17 under the detection section 18. Light from the back light 17 is upwardly radiated by passing through the frame display section 20 and the content-of-operation display section 21, so that the user can recognize the content and the position of the operation switch 32a. Such a back light 17 is provided for each of the operation switches, such that the plurality of operation switches 30a to 34a illustrated in FIG. 1 can be individually lighted, and only the operation switches usable in every operation condition of the induction heating cooking device are lighted. For example, the back light 17 lights the heating-power controlling operation switch 32a only during heating.

The induction heating cooking device according to the present invention includes a light shield section 22 for interrupting the light from the back light 17, around the outer periphery of the detection section 18. The light shield section 22 is, for example, a light absorption film having a black color with an optical transmittance of about zero. The light shield section 22 is printed on the back surface of the top plate 11, such that the position of the inner edge of the light shield section 22 falls within the range of the width of the electrode 19a outside the frame display section 20, that is, it is inside the outer edge of the electrode 19a but outside the inner edge of the electrode 19a and, also, the position of the outer edge of the light shield section 22 is outside the outer edge of the back light 17.

The connection section 16 is provided in such a direction that it is far from the user, such that it is directly connected to a portion of the outer edge of the detection section 18. The connection section 16 has an outer shape with a width size which is smaller than that of the detection section 18 and is enough to allow the connection section 16 to contact with the connection terminal 23. Further, the connection section 16 is provided such that a major portion of the connection section 16 is outside the back light 17, in order to prevent the back light 17 and the connection terminal 23 from interfering with each other to cause the connection terminal 23 to reflect light.

A printed wiring board 24 is provided under the top plate 11, and the printed wiring board configures a high-frequency oscillation unit which applies a high-frequency voltage to the connection terminal 23 and a circuit for detecting that a person has touched the electrodes 19. The connection terminal 23 is contacted at both ends with the printed wiring board 24 and with the connection section 16, so that the detection section 18 and the printed wiring board 24 are electrically connected to each other. Further, the back light 17 is connected to the printed wiring board 24 through a lead wire.

In FIG. 2 and FIG. 3, there is exemplified the operation switch 32a exhibiting a triangular shape for controlling the heating power, and, in the operation switches 30a, 33a and 34a exhibiting characters of "Timer", "Heating" and "Menu" and the like in FIG. 1, similarly, a content-of-operation display sections 21 as a character portion, and a frame display section 20 for approximately indicating the size and the position of the outer periphery of the detection section 18 are formed by cutting them out from the electrodes 19. Further, the content-of-operation display sections 21 can also be adapted, through cutting out, to display an indication of control commands which are assigned to the operation switches, such as numerical characters, symbols and pictorial symbols, as well as characters.

With the operation switches 30a to 34a having the aforementioned structures, if a user's finger touches the top plate 11 at a position which is opposed to the detection section 18, this changes the capacitance between the electrodes 19 and the ground, since the human body is connected to the ground through electric resistances and capacitances equivalently. Since a high-frequency voltage is applied to the electrodes 19 from the printed wiring board 24 through the connection terminal 23, the change of the capacitance is transmitted through the connection terminal 23 to the printed wiring board 24, and it is determined that the user has operated this operation switch 30a to 34a. For example, the printed wiring board 24 reads out the change of the magnitude of the voltage applied to the electrodes 19 and, thus, determines the change of the capacitance. Thus, the control indicated by the content-of-operation display sections 21 in the operation switches 30a to 34a is performed. Even though the electrodes 19 are separated from one another through the content-of-operation display section 21 and the frame display section 20, the separated electrodes 19 are electrically connected to one another through the capacitances formed among the separated electrodes 19. Accordingly, even if the user touches only an electrode which is not directly connected to the connection section 16, such as the electrode 19b inside the frame display section 20, an electric signal is transferred from the electrode 19b inside the frame display section 20 to the electrode 19a outside thereof through the capacitance, which enables detecting that the user has touched the electrode.

In the present embodiment, the frame display section 20 is formed by cutting it out from the electrodes 19, which can eliminate the necessity of providing a transparent portion for letting light through around the outer periphery of the detection section 18 as in the conventional art. This enables providing the connection section 16 such that it contacts with the detection section 18 or is significantly close to the detection section 18. Accordingly, if the user touches the connection section 16, it is assumed that he or she has tried to touch the detection section 18. Therefore, even if the connection section 16 is touched and it is determined that the operation switches 30a to 34a have been operated, it is possible to prevent the user from feeling uncomfortable.

Further, the connection section 16 is placed in such a direction that it is farther from the user than the detection section 18, and the connection section 16 has an outer shape with a size smaller than that of the detection section 18. These facts possibly prevent the user from touching the connection section 16 by mistake.

Further, since the connection section 16 is provided such that a major portion of the connection section 16 is outside the back light 17 indicated by a broken line, it is possible to suppress the occurrence of luminance unevenness in the frame display section 20 due to the shadow of the connection terminal 23 which is contacted with the connection section 16. Further, it is possible to prevent the connection terminals 23 from reflecting light from the back light 17, which suppresses the occurrence of luminance unevenness in the frame display section 20 and the content-of-operation display section 21. Further, since the connection terminal 23 is not placed above the back light 17, it is possible to reduce the size of the gap between the main body 25 and the top plate 11, thereby enabling reduction of the thickness of the induction cooking apparatus as a product.

Conventionally, the connection section has been separated from the detection section, and the transparent portion (the light emitting portion) has been partially chipped due to the connection conductive wiring for connecting the detection section to the connection section. However, in the present embodiment, the frame display section 20 is formed by cutting it out from the electrodes 19, which prevents the frame display section 20 from being partially chipped and, thus, allows the frame display section 20 to have a complete rectangular shape. This can improve the appearance thereof over the prior art. Further, the frame display section 20 is not required to have a rectangular shape and also can have a circular shape or an elliptical shape, and it is also possible to round the corner portions of the rectangular shape.

Further, the light shield section 22 is required only to have an inner edge at a position which falls within the range of the width of the electrode 19a outside the frame display section 20. Accordingly, even if the printing of the light shield section 22 is slightly deviated from a position near the outer edge of the electrode 19a toward the inner edge thereof, the light shield section 22 is prevented from covering the frame display section 20. In other words, there is allowance for the limit of the position of the inner edge of the light shield section 22, and this allowance corresponds to the width of the electrode 19a outside the frame display section 20. This prevents unevenness of the width of the frame display section 20 due to the deviation of the printing of the light shield section 22.

Further, since the content-of-operation display section 21 is formed by cutting it out from the electrodes 19, it is possible to provide the advantage that the visual recognition can be facilitated in light navigation by lighting only the usable operation switches 30a to 34a. Also, in case that a transparent film with a low optical transmittance is formed by printing in the portions of the frame display section 20 and the content-of-operation display section 21, the shapes of the frame display section 20 and the content-of-operation display section 21 becomes difficult to be seen when the back light 17 is turned off. For example, this makes it possible to turn off the unusable operations switches out of the operation switches 30a to 34a and to provide the operation guiding effect more effectively. For example, it is also possible to offer the same effect by forming the top plate 11 from an optically-transparent material colored in a block color instead of forming a transparent film with a low optical transmittance in the portions of the frame display section 20 and the content-of-operation display section 21.

Further, the electrodes 19a to 19d can be formed from, for example, coating films made of conductive paint, screen-printed films or vapor-deposited metal films. The electrodes 19a to 19c configuring the detection section 18 and the electrode 19d configuring the connection section 16 may be either the same electrodes or separately-formed electrodes. While the electrodes 19a to 19d are provided on the back surface of the top plate 11 in the present embodiment, the electrodes 19a to 19d may be provided either on the front surface of the top plate 11 or on both the front surface and the back surface of the top plate 11.

Further, the area of the detection section 18 is required only to have a size which enables detecting that the user has touched thereto without inducing a lack of the area of the detection section 18 when the frame display section 20 and the content-of-operation display section 21 are formed by cutting them out from the electrodes 19.

Further, while the electrode 19a outside the frame display section 20 and the electrode 19b inside the frame display section 20 are completely separated from each other through the frame display section 20 in the present embodiment, it is also possible to provide the frame display section 20 such that the outside electrode 19a and the inside electrode 19b are partially connected to each other at one or more portions, rather than being completely separated from each other. For example, it is possible to form coupling sections 20a and 20b with a predetermined width of, for example, 0.5 mm to 1 mm, at corner portions of the frame display section 20 in FIG. 2 or at two portions near them, from the same material as that of the electrodes 19a and 19b. This causes the outside electrode 19a and the inside electrode 19b to be certainly and electrically connected to each other, which increases the reliability of detection. Further, they are connected to each other at the corner portions of the frame display section 20 along a diagonal line, which can alleviate the uncomfortable feeling even though the frame display section 20 is partitioned. Similarly, it is also possible to provide the content-of-operation display section 21 such that the electrode 19c and the electrode 19b separated from each other by the content-of-operation display section 21 are partially connected to each other.

Further, the respective operation switches 30a to 34a in the operation section 13 illustrated in FIG. 1 are merely illustrative, and it is also possible to provide operation switches for commands of other operations with the same structure as that of the present embodiment.

Further, while the top unit is constructed by the top plate 11 and the metal frame in the present embodiment, it is also possible to eliminate the metal frame.

Further, while the cooking device has been described as being an induction heating cooking device in the present embodiment, it is also possible to employ the operation section according to the present invention on a top plate in a cooking device having a halogen-type or radiant-type heater under the top plate or a gas cooking device having, for example, a gas burner provided under a hole formed in the top plate and a trivet provided on the top plate for placing an object to be heated thereon.

The cooking device according to the present invention has the effect of preventing erroneous operations which are not intended by users, and is usable as a cooking device which includes a top plate that is provided at an upper portion of main body and has an operation section formed on its back surface or its front surface, and is capable of heating the bottom surface of an object to be heated at the upper portion of main body, such as an induction heating cooking device, a gas cooking device, a radiant-type cooking device, and a halogen-type cooking device.

The invention claimed is:

1. A cooking device comprising:
 a top plate that is provided on an upper portion of a main body;
 a heating section operable to heat a bottom surface of an object to be heated that is placed on the upper portion of the main body;
 a control unit operable to control a heating output of the heating section;
 at least one operation switch that is provided at the top plate;
 a light source operable to illuminate the at least one operation switch; and
 a connection terminal operable to electrically connect the at least one operation switch to the control unit;
 wherein the at least one operation switch includes a conductive detection section operable to detect that a user touches the conductive detection section based on capacitance change, and
 a conductive connection section that is contacted with the connection terminal,
 wherein the connection section is directly connected to a portion of an outer edge of the detection section;
 wherein the connection section has an outer shape with a width size which is smaller than a width size of the detection section;
 wherein an entirety of the connection section has a uniform width size as viewed from above; and
 wherein the at least one operation switch comprises a plurality of operation switches, and the light source illuminates only the operation switch or switches usable in an operating condition of the cooking device.

2. The cooking device according to claim 1, wherein the at least one operation switch further includes a frame display section constituted by a cut out portion provided inside of the detection section to display a frame of the detection section.

3. The cooking device according to claim 2, wherein the at least one operation switch is further provided, inside the frame display section, with a content-of-operation display section constituted by a cut out portion provided inside of the detection section to indicate a content of the operation switch.

4. The cooking device according to claim 1, wherein the connection section is provided in a backward direction with respect to the detection section.

5. The cooking device according to claim 1, wherein the detection section is provided above the light source, and a portion of the connection section is provided outside the light source.

6. The cooking device according to claim 1, wherein the at least one operation switch comprises a plurality of operation switches, and the light source illuminates only the operation switch or switches usable in an operating condition of the cooking device.

7. A cooking device comprising:
 a top plate that is provided on an upper portion of a main body;
 a heating section operable to heat a bottom surface of an object to be heated that is placed on the upper portion of the main body;
 a control unit operable to control a heating output of the heating section;
 at least one operation switch that is provided at the top plate;
 a light source operable to illuminate the at least one operation switch; and
 a connection terminal operable to electrically connect the at least one operation switch to the control unit;
 wherein the at least one operation switch includes
 a conductive detection section operable to detect that a user touches the conductive detection section based on capacitance change,
 a conductive connection section that is contacted with the connection terminal, and
 a frame display section constituted by a cut out portion provided inside of the detection section to display a frame of the detection section,
 wherein the connection section is directly connected to a portion of an outer edge of the detection section; and wherein the cooking device further comprises a light shield section operable to prevent light from the light source from being directed to a front portion of the top plate, around the outer periphery of the detection section, wherein an inner edge of the light shield section falls within the range between an outer edge of the frame display section and an outer edge of the detection section, and wherein an outer edge of the light shield section is outside the outer edge of the light source.

8. A cooking device comprising:

a top plate that is provided on an upper portion of a main body;

a heating section operable to heat a bottom surface of an object to be heated that is placed on the upper portion of the main body;

a control unit operable to control a heating output of the heating section;

at least one operation switch that is provided at the top plate;

a light source operable to illuminate the at least one operation switch; and a connection terminal operable to electrically connect the at least one operation switch to the control unit;

wherein the at least one operation switch includes a conductive detection section operable to detect that a user touches the conductive detection section based on capacitance change, and a conductive connection section that is contacted with the connection terminal, wherein the connection section is directly connected to a portion of an outer edge of the detection section;

wherein the connection section has an outer shape with a width size which is smaller than a width size of the detection section;

wherein an entirety of the connection section has a unidom width size as viewed from above; and wherein the at least one operation switch further includes a frame display section constituted by a cut out portion provided inside of the detection section to display a frame of the detection section.

9. The cooking device according to claim 8, wherein the at least one operation switch is further provided, inside the frame display section, with a content-of-operation display section constituted by a cut out portion provided inside of the detection section to indicate a content of the operation switch.

* * * * *